US008301828B2

(12) United States Patent
Miller

(10) Patent No.: US 8,301,828 B2
(45) Date of Patent: Oct. 30, 2012

(54) SYSTEMS AND METHODS FOR RELIABLE MULTI-LEVEL CELL FLASH STORAGE

(75) Inventor: Mark E Miller, Mission Viejo, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 209 days.

(21) Appl. No.: 12/792,592

(22) Filed: Jun. 2, 2010

(65) Prior Publication Data
US 2011/0302354 A1 Dec. 8, 2011

(51) Int. Cl.
*G06F 12/00* (2006.01)
(52) U.S. Cl. ............... 711/103; 365/185.03; 365/185.33
(58) Field of Classification Search .................. 711/103; 365/185.03
See application file for complete search history.

(56) References Cited

U.S. PATENT DOCUMENTS

| 5,450,363 | A | | 9/1995 | Christopherson et al. |
| 6,097,637 | A | * | 8/2000 | Bauer et al. ............... 365/185.24 |
| 7,746,704 | B1 | * | 6/2010 | Tang et al. ............... 365/185.28 |
| 2004/0080979 | A1 | * | 4/2004 | Park ........................ 365/185.03 |
| 2011/0153912 | A1 | * | 6/2011 | Gorobets et al. ............ 711/103 |
| 2011/0280082 | A1 | * | 11/2011 | Ruby et al. ............... 365/185.19 |

OTHER PUBLICATIONS

Integrated Circuit Engineering; Memory 1997; Chapter 10: Flash Memory Technology; 16 pages, Jan. 1, 1997.
Martin; Robert R.; Multi-Level Cell Flash Memory Fault Testing and Diagnosis; Thesis; The University of Cincinnati; 158 pages, Jun. 15, 2005.
Desnoyers, Peter; Empirical Evaluation of NAND Flash Memory Performance; HotStorage 2009, 5 pages, Workshop date: Oct. 11, 2009.
Fazio, Al, et al.; Intel Strataflash Memory Technology Development and Implementation; Intel Technology Journal Q4'97; 13 pages, Oct. 1, 1997.
Sanvido, Marco A.A., et al; NAND Flash Memory and Its Role in Storage Architectures; Proceedings of the IEEE, vol. 96, No. 11, 1864-1874; Nov. 2008.
Cho, Taehee, et al; A Dual-Mode Nand Flash Memory: 1-GB Multilevel and High-Performance 512-MB Single-Level Modes; IEEE Journal of Solid-State Circuits, vol. 36, No. 11, 1700-1706, Nov. 2001.

* cited by examiner

*Primary Examiner* — Hashem Farrokh
(74) *Attorney, Agent, or Firm* — Jackson Walker L.L.P.; Christopher J. Rourk

(57) ABSTRACT

Multi-level cell (MLC) flash memory has become widely used due to their capacity to store more information in the same area as a single-level cell (SLC) flash memory. This makes MLC flash memory very attractive for storing media. Flash has also traditionally been used in electronic devices for firmware, but MLC flash is less reliable than SLC flash. For critical memory operations, MLC flash memory can be made as reliable as SLC flash by mapping one binary value to an MLC state corresponding to the highest threshold voltage and the other binary value to the MLC state corresponding the lowest threshold voltage when writing to the MLC flash, and by mapping all MLC states with corresponding threshold voltages above a central cutoff threshold voltage to one binary value and by mapping all MLC states with corresponding threshold voltages below a central cutoff threshold voltage to the other binary value.

27 Claims, 12 Drawing Sheets

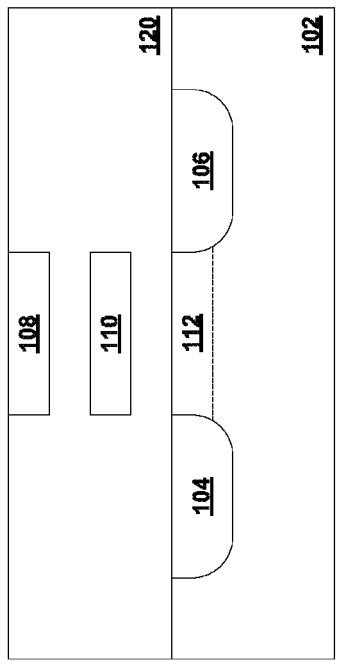
FIG. 1 (Prior Art)
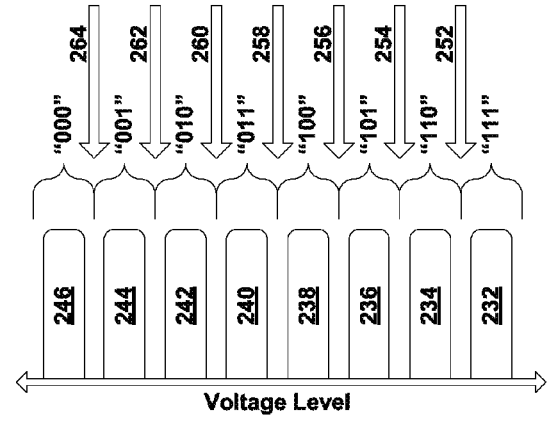
FIG. 2C (Prior Art)
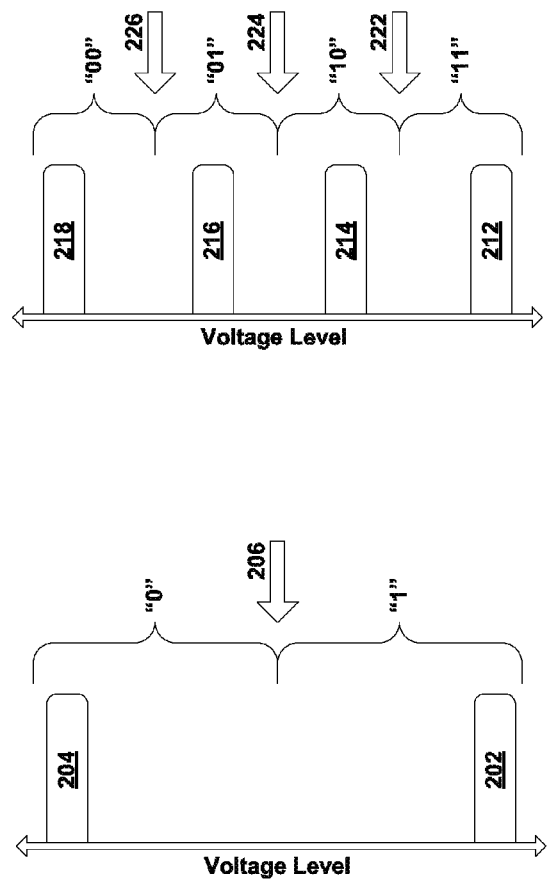
FIG. 2B (Prior Art)
FIG. 2A (Prior Art)

SYSTEMS AND METHODS FOR RELIABLE MULTI-LEVEL CELL FLASH STORAGE

TECHNICAL FIELD

The present invention relates generally to flash memory and more specifically to flash memory with robust use of multi-level cells.

BACKGROUND OF THE INVENTION

Flash memory is a non-volatile computer memory that can be electrically erased and reprogrammed. It is a specific type of EEPROM (Electrically Erasable Programmable Read-Only Memory) that is erased and programmed in large blocks. It derives its name from the early days when the entire chip had to be erased at once, a "flash erase." Due to its low cost compared to both other forms of EEPROMs or battery-powered random access memory (RAM), flash memory has become a dominant technology when non-volatile, solid state storage is need.

Originally, the main application of flash memory was to store firmware for a computer or electronic device. The non-volatility makes it suitable for storing critical software, including boot code, and the reprogrammability gives it the flexibility to accept firmware changes. Many devices with general purpose processors, including computer motherboards, use flash memory as their boot ROM.

In addition to non-volatility, flash memory has faster access time and provides better shock resistance than standard disk media, such as a hard drive. The capacity of large flash memory now rivals some disk media, such as compact discs (CD) and digital video disks (DVD). Flash media has become a popular method of storing various types of media, such as digital photographs, music and video.

To obtain the increased capacity in flash memory while maintaining a low cost, multi-level cell flash memory has been used. FIG. 1 illustrates a typical flash memory cell. This is often called a floating gate transistor, because it resembles a metal-oxide-semiconductor (MOS) field effect transistor (FET). Like a MOSFET, the floating gate transistor comprises drain 104 and source 106 fabricated onto substrate 102. On the substrate is formed an insulator 120, which is often an oxide. Conductive gate 108 is also fabricated on the insulator 120. Unlike a MOSFET, the floating gate transistor further comprises floating gate 110, located between gate 108 and substrate 102. In a floating gate transistor, gate 108 is referred to as the control gate to distinguish it from the floating gate.

In a MOSFET (ignoring floating gate 110 of FIG. 1), when a voltage is applied to gate 108 relative to substrate 102, channel 112 is formed allowing current to flow between source 106 and drain 104. When a MOSFET operates in enhancement mode such as this, current does not immediately flow because sufficient charge needs to build up in channel 112 to overcome the natural charge imposed by the doping of substrate 102. The voltage required to bring sufficient charge to channel 112 is known as the threshold voltage. In a floating gate transistor, floating gate 110 has a charge, which, depending on its polarity either enhances or screens the effect of the charge on control gate 108, altering the threshold voltage needed at control gate 108. Because floating gate 110 is encased in an insulator, charge on floating gate 110 is trapped and does not change. In practice, the charge on floating gate 110 can remain trapped for years, and a non-volatile memory is thus formed.

There are two popular configuration of flash cells, NOR flash and NAND flash. They are so named because the way the floating gate transistors are connected together resembles a NOR or NAND gate, respectively. Under normal conditions the charge on floating gate 110 does not change. However, as in the case of NOR flash, electrons can be injected onto floating gate using hot electron injection and removed through quantum tunneling. In the case of NAND flash, electrons can be tunneled through the insulator onto the floating gate using tunneling injection and removed through tunneling release.

By measuring the threshold voltage, the information stored in a flash memory cell can be read. In the simplest case, binary data is stored in a memory cell. As shown in FIG. 2A, when flash is erased (i.e., charge is removed from the floating gate) the threshold voltage is the natural threshold voltage of the MOSFET, so the threshold voltage is approximately voltage 202 and the cell is in the "1" state. To program a "0", charge is imparted to the floating gate to drive the threshold voltage up to voltage 204. To read the value of the floating gate cell, the threshold voltage of the cell is compared to cutoff voltage 206. If the threshold voltage is greater than cutoff voltage 206, then a "0" is read from the flash memory cell. If the threshold voltage is less than the cutoff voltage 206, a "1" is read from the flash memory cell.

To increase capacity, modern flash employs multi-level cells (MLCs). A single-level cell (SLC), as described in FIG. 1, stores one bit corresponding to two states. MLC use four or more states to store two or more bits of information per cell. For example in FIG. 2B, in the erased state the flash memory cell the floating gate has no charge and the threshold voltage is voltage 212, so the flash memory cell has a natural state of "11". To program a "10", sufficient charge is imparted to the floating gate to drive the threshold voltage down up to voltage 214. To program a "01", even more charge is imparted to the floating gate to drive the threshold voltage up to voltage 216. To program a "00", even more charge is imparted to the floating gate to drive the threshold voltage up to voltage 218. To read the various values, the threshold voltage is compared to cutoff voltages 222, 224, and 226.

FIG. 2C shows threshold voltages used in 3-bit per cell (3BPC) flash memory cell. The erased stated of the 3BPC cell is "111" with a threshold voltage equal to voltage 232. To program "110", "101", "100", "011", "010", "001" and "000", sufficient charge is imparted onto the floating gate to drive up the threshold voltage to voltages 234, 236, 238, 240, 242, 244, and 246, respectively. To read the value of the 3BPC cells, the threshold voltage is compared to cutoff voltages 252, 254, 256, 258, 260, 262 and 264. Beyond 3BPC cells, recent innovations have made 4-bit per cell (4BPC) flash memory cells feasible.

MLCs offer higher capacity in the same number of cells, thus reducing the cost for the amount of storage. The reliability, however, is often lower because the adjacent voltage levels used to represent different voltage levels are closer together, so charge leaking to or from a control gate can result in an unwanted transition in the logical state of the cell. For media applications a small amount of error is generally acceptable and may even be unperceivable by the end user. For example, an incorrect bit or bits in a movie could result in a block being distorted or in a song could result in an inaudible pop. However, for firmware applications and especially boot ROM applications, a bit error would mean an incorrect instruction would be read from flash causing the firmware to malfunction.

Due to the dual requirements of flash memory, many devices use both SLC flash and MLC flash. SLC is used for the high reliability lower capacity storage such as boot ROM and MLC is used for the high capacity, lower reliability storage. FIG. 3 shows a typical electronic device, it comprises processing unit 302, which can be a processor, application specific integrated circuit (ASIC) or other circuit which is used to control the electronic device, volatile memory 306, which can be random access memory (RAM) including dynamic random access memory (DRAM) and/or static random access memory (SRAM) and/or other forms of volatile memory, and other circuitry 304, which is device specific circuitry that performs the functions of the particular device. For example, other circuitry 304 in a digital camera can include charge-coupled devices (CCD), image processing circuitry, display circuitry and drivers; other circuitry in an MP3 player could include an audio driver; other circuitry in a multi-function peripheral could include printer, scanner and fax circuitry. Additionally, the electronic device comprises memory controller 312 coupled to firmware flash 314 and memory controller 316 coupled to media flash 318. The memory controllers, processing unit 302, device specific circuitry 304 and volatile memory 306 are communicatively coupled often through the use of a data bus such as data bus 310. Memory controller 312 and memory controller 316 can also directly communicate with other circuits through direct memory access (DMA). Due to the reliability and capacity requirements, firmware flash 314 is often SLC flash and media flash 318 is often MLC flash. The use of two different types of flash, each likely requiring its own memory controller, increases the cost, size and complexity of the electronic device.

SUMMARY OF INVENTION

An electronic device such a digital camera, a printer, a multi-function peripheral, a scanner, a music player, a portable video game, a camcorder, a digital picture frame, a cellular telephone, or a combination thereof, comprising a processing unit, MLC flash memory and a memory controller. The MLC flash memory comprises a a critical portion and can further comprise a non-critical portion. Each memory cell in the critical portion of the MLC flash memory is mapped to a single binary value. If the memory cell is in an MLC having a threshold voltage greater than a cutoff threshold voltage, the value read is interpreted as a high binary value. Otherwise, the value read is interpreted as a low binary value.

The memory controller can write into the critical portion data which has been pre-encoded such that it contains only values selected from a high MLC value (corresponding to the highest MLC state) or a low MLC value (corresponding to the lowest MLC state).

Alternatively, the memory controller may also encode binary data by assigning a high MLC value (corresponding to a highest MLC state) to a high binary value and by assigning a low MLC value (corresponding to a lowest MLC state) to a low binary value.

In another embodiment, the memory controller writes pre-encoded data into a static portion of the critical portion and encodes binary data as MLC data prior to writing into a dynamic portion of the critical portion.

In the case of a 2BPC flash memory, the high MLC value can be "11" and the low MLC value can be "00." In the case of a 2BPC flash memory using Gray coding, the high MLC value can be "10" and the low MLC value can be "00." In the case of a 3BPC flash memory, the high MLC can be "111" and low MLC value can be "000." In the case of a 4BPC flash memory, the high MLC value can be "1111" and low MLC value can be "0000."

A MLC flash can be partition into a critical and non-critical portion, each portion comprising a plurality of memory cells. Only a high MLC value and a low MLC value corresponding to the highest MLC state and the lowest MLC state are stored in the critical portion. Any MLC value can be stored in the non-critical portion.

The partitioned MLC flash can be read by reading data at a given memory address. When the data is in the critical portion, MLC values corresponding to MLC states with corresponding threshold voltages greater than the central cutoff threshold voltage are interpreted as a high binary value otherwise they are interpreted as a low binary value. The reading of data can further comprise the steps of obtaining a physical address from a logical to physical mapping. Furthermore, b data units at a time are read from the critical portion where each memory cell stores b bits. The b data units are then decoded into a single data unit.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 1 illustrates a prior art flash memory cell;

FIG. 2A shows the relationships between threshold voltages and program states in a prior art SLC flash memory cell;

FIG. 2B shows the relationships between threshold voltages and program states in a prior art 2BPC MLC flash memory cell;

FIG. 2C shows the relationships between threshold voltages and program states in a prior art 3BPC MLC flash memory cell;

FIG. 4A shows an embodiment of a binary value to MLC state mapping for programming a 2BPC MLC;

FIG. 4B shows an embodiment of a MLC state to binary value for reading a 2BPC MLC in SLC mode;

FIG. 5A shows an embodiment of a binary value to MLC state mapping for programming a 3BPC MLC;

FIG. 5B shows an embodiment of a MLC state to binary value mapping for reading a 3BPC MLC in SLC mode;

FIG. 6A shows an embodiment of a binary value to MLC state mapping into a 2BPC MLC using Gray code encoding;

FIG. 6B shows an embodiment of a MLC state to binary value mapping for reading a 2BPC MLC using Gray code encoding in SLC mode;

DETAILED DESCRIPTION

Figure 3:
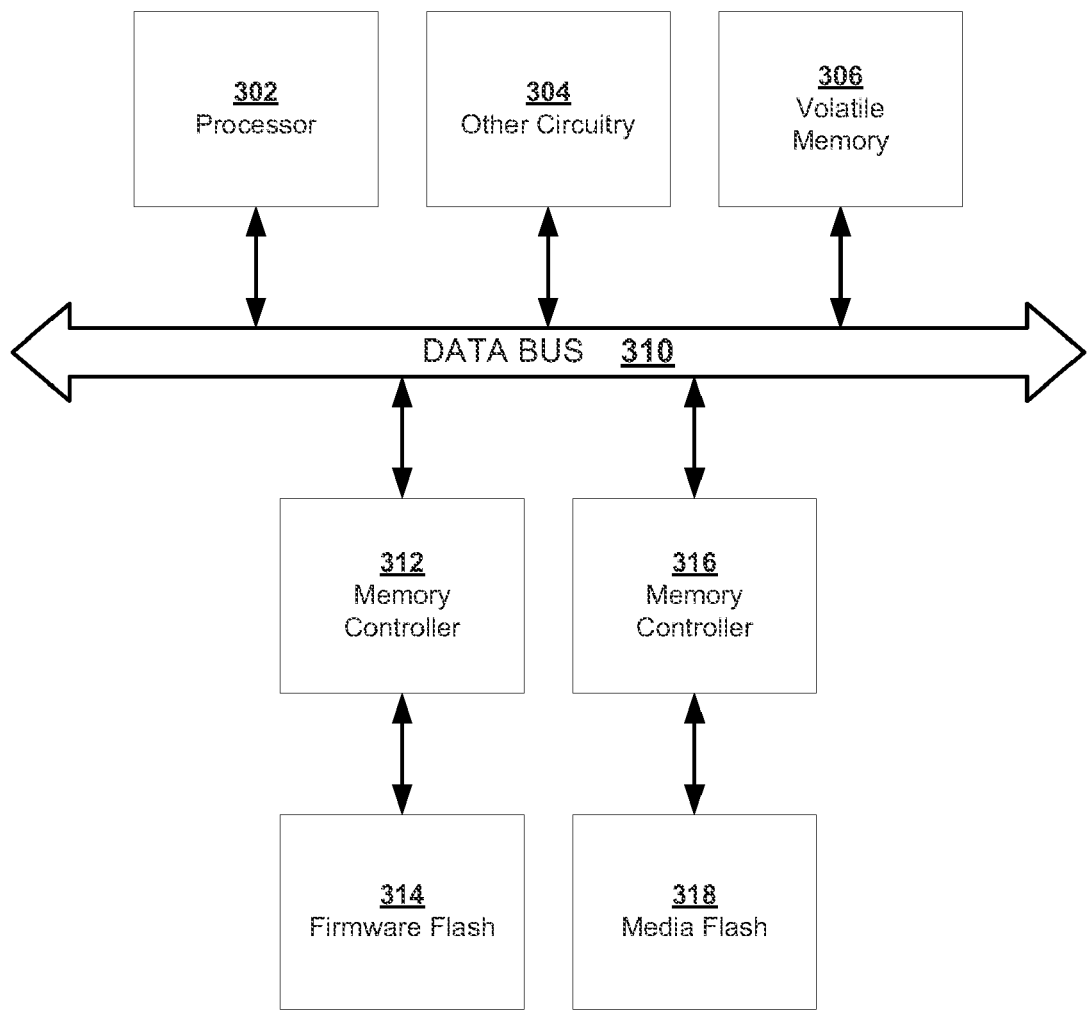
FIG. 3 shows an exemplary prior art electronic device using a separate flash for firmware and for media.

A detailed description of embodiments of the present invention is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure.

In an embodiment of the present invention, an MLC storage device is converted into high reliability storage by storing a single binary value to each cell in an MLC. The entire MLC storage device can be converted or a portion. In the former case, MLC memory could be more available or much cheaper than SLC memory so the MLC memory could be used in place of SLC memory. In the latter case an electronic device can be partitioned into a critical portion for storing critical data such as firmware and a non-critical portion for storing non-critical but potentially higher capacity data such as media.

In a preferred embodiment of a binary value to MLC state mapping, a first binary value is mapped to the state corresponding to the lowest threshold voltage of the MLC, regardless of the labeling of the MLC states. This state is referred to herein as the lowest MLC state and its corresponding MLC value as the lowest MLC value. The second binary value is mapped to the state corresponding to the highest threshold voltage, which is referred to herein as the highest MLC state and its corresponding MLC value as the highest MLC value. (It should be noted that the highest (or equivalently lowest) MLC value corresponds to the MLC state having the highest (or lowest) threshold voltage and not to the largest numeric value. For example, in a Gray coded MLC, the highest MLC value is "10" even though "11" is numerically larger. This is because the MLC value of "10" corresponds to the highest threshold voltage.) In the MLC to SLC mapping, any MLC state corresponding to a threshold voltage below a central cutoff threshold voltage is mapped to the first binary value, and any MLC state corresponding to a threshold voltage above the central cutoff threshold is mapped to the second binary value.

Using the MLC flash cell of FIG. 2B as a reference, the MLC memory cell is programmed to store either a "0", which is mapped to MLC memory cell as "00", or "1", which is mapped to MLC memory cell as "11". Because the cell is programmed to mimic a SLC cell, any threshold voltage below cutoff voltage 224 should be considered a "0" which corresponds to the MLC states corresponding to the MLC values of "00" or "01." Likewise, an MLC value of "10" or "11" should be interpreted as a "1." If FIG. 2A and FIG. 2B are of the same scale, then by using this programming and reading technique, the MLC is made to behave as an SLC with tolerances and reliability that approximate an SLC.

In accordance with an embodiment of the invention, binary data is written into an MLC flash memory by assigning an MLC state to a binary value, referred to as a binary value to MLC state mapping. When reading from the MLC flash memory, each MLC state is identified with an MLC value which is then mapped to a binary value. For the sake of clarity, each MLC state of a memory cell is identified by its MLC value. For example, the second state from the top in FIG. 2B is referred to as the "01" MLC state because that state when read as MLC flash memory would be assigned the value "01."

FIG. 4A shows an embodiment of a binary value to MLC state mapping for programming a 2BPC MLC. The "0" binary value is written to the "00" MLC state which corresponds to the highest threshold voltage implemented by the MLC. The "1" binary value is written to the "11" MLC state which corresponds to the lowest threshold voltage implemented by the MLC.

FIG. 4B shows an embodiment of a MLC state to binary value mapping for reading a 2BPC MLC in "SLC mode." The "00" and "01" states are read as a binary value of "0" and the "10" and "11" states are read as a binary value of "1." More generally, all states having voltages above a central cutoff voltage such as voltage 224 in FIG. 2B are read as the binary value of "0" and all states having voltages below the central cutoff voltage are read as the binary value of "1." For example, the "00" MLC state has threshold voltage 218, and the "01" MLC state has threshold voltage 216, both of which are above the central cutoff voltage of 224. Similarly the "10" MLC state has threshold voltage 214 and the "11" MLC state has threshold voltage 212, both of which are below the central cutoff voltage of 224.

FIG. 5A shows an embodiment of a binary value to MLC state mapping for programming a 3BPC MLC. A 3BPC MLC can be written and read similarly in an "SLC mode." For example, to program the 3BPC cell, the binary value "0" is written to the "000" MLC state which corresponds to the highest threshold voltage implemented by the MLC, e.g., voltage 246 in FIG. 2C. The binary value "1" is written to the "111" MLC state which corresponds to the lowest threshold voltage implemented by the MLC, e.g., voltage 232.

FIG. 5B shows an embodiment of the MLC to SLC mapping for reading a 3BPC MLC in SLC mode. The "000", "001", "010" and "011" MLC states are read as the binary value of "0" and the "100", "101", "110" and "111" MLC states are read as the binary value of "1." This mapping treats the 3BPC memory cell as a SLC cell with cutoff voltage 258. For charge leakage to effect the integrity of the stored data, programmed value of "000" (i.e., "0") would have to drift through "001", "010" and "011" before it would be erroneously read as a "1". In this example, MLC states above the central cutoff voltage of voltage 258 are read as a binary value of "0" and those below are read as a binary value of "1."

Similarly, for an n-BPC memory cell, a binary value of "0" would be written to the MLC state corresponding to the highest threshold voltage, for example the MLC state having an MLC value expressed as n "0"s and a binary value of "1" would be written to the MLC state corresponding to the highest threshold voltage, for example the MLC state having an MLC value expressed as n "1"s. In reading the n-BPC MLC memory, all states having a threshold voltage below the central cutoff voltage would be read as a binary "0" and all states having a threshold voltage below the central cutoff voltage would be read as a binary "1." It should be noted that when the central cutoff voltage divides the MLC states in half between those read as a "0" and those read as a "1.", then the MLC state to binary value mapping simply retains the most significant bit of the MLC value corresponding to the MLC state. For example, in a 4BPC memory cell both the "1010" MLC state and "1001" MLC state are read as a "1" because "1" is the most significant bit of "1010" and "1001".

Some flash memories map threshold voltages to Gray code values, rather than standard binary codes, to reduce the bit error rate of a flash memory. For example, in FIG. 2B, rather than the highest threshold voltage range corresponding to the "11" MLC value it corresponds to the "10" MLC value and the next highest threshold voltage range would correspond to the "11" MLC value. When using a binary code, a drift from a threshold voltage of 216 to 214 would corresponds to a two bit error (i.e., from "01" to "10"). If a Gray code were used instead only a one bit error would occur (i.e., from "01" to "11").

FIG. 6A shows an embodiment of a binary value to MLC state mapping into a 2BPC MLC using Gray code encoding. This differs from the program mapping given in FIG. 4A in that a "1" is now written to the "10" MLC state rather than the "11" MLC state because the "10" MLC state corresponds to the highest threshold voltage, even though numerically as a binary number "10" is not the highest MLC value.

FIG. 6B shows an embodiment of a MLC state to binary value mapping for reading a 2BPC MLC using Gray code encoding in SLC mode. The "00" MLC state and the "01" MLC state are read as the binary value of "0" and the "10" MLC state and the "11" MLC state are read as the binary value of "1." In this example, the "00" MLC state and the "01" MLC state have threshold voltages above a central cutoff voltage and the "10" MLC state and the "11" MLC state have threshold voltages below a central cutoff voltage. As an example referring to FIG. 2B, the "00" MLC state, the "01" MLC state, the "10" MLC state, and the "11" MLC state would have threshold voltages corresponding to voltages 212, 214, 216, and 218, respectively and voltage 224 could serve as a central cutoff voltage. The MLC state to binary value shown here extracts the most significant bit of the corresponding MLC value.

As another example, suppose the flash memory is a 3BPC flash memory using a Gray code. The highest MLC value would be "100" rather than "111" and the lowest MLC value would still remain "000."

Figure 7:
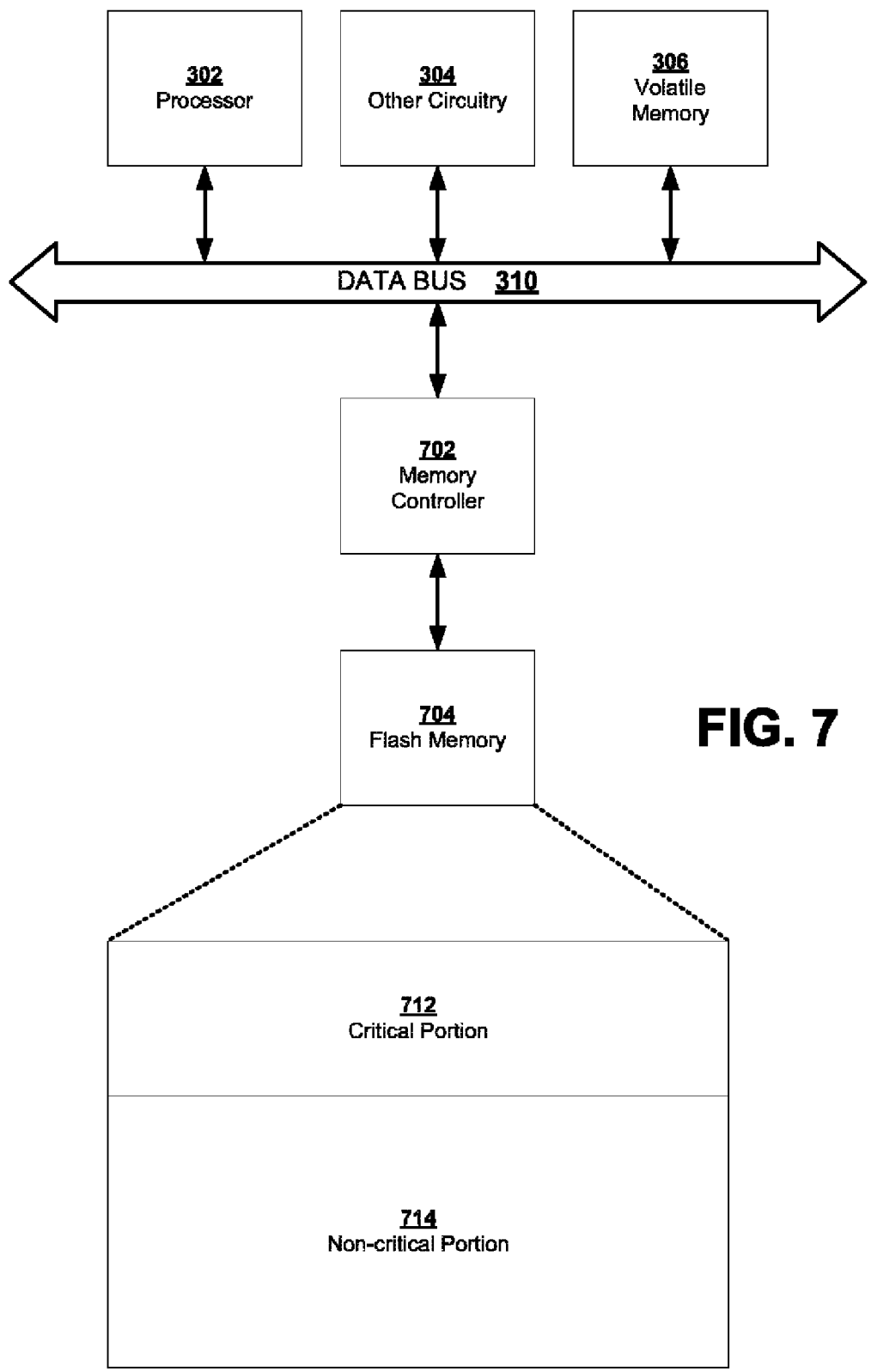
FIG. 7 shows an embodiment of an electronic device using a single MLC flash memory for both firmware and media.

FIG. 7 shows an improved electronic device using a single MLC flash memory for both firmware and media storage. The electronic device comprises processor 302, device-specific circuitry 304, and volatile memory 306 which communicate through data bus 310. The electronic device further comprises memory controller 702 and flash memory 704. Flash memory is logically partitioned into critical portion 712 and non-critical portion 714. Memory controller 702 determines whether the data read is in critical portion 712, and if it is, an appropriate MLC state to binary mapping used to read the data, (e.g., retaining the most significant bit from cell read). Critical portion 712 can be used to hold boot code or other firmware. Non-critical portion 714 can be used to hold media, other high volume data, and/or other data.

In an alternative embodiment, the electronic device comprises only a critical portion. Examples of such a device include embedded systems such as a wireless router, DVD player or automotive engine controller, where flash memory is used to store firmware, but there is no need for high capacity media memory. Because of the mass production and availability of MLC memory, MLC flash may be a more cost effective choice than SLC flash.

Because there is no physical partitioning of the flash memory, memory controller 702 can redefine the partition between critical portion 712 and non-critical portion 714 as the need arises. Another consideration in the manner of partitioning the flash is that the non-critical portion may be required to change much more frequently than the critical portion. Because flash reliability declines with repeated use and erasures, in a preferred embodiment the media and critical portions of the flash memory do not share the same flash memory blocks. In one embodiment, the flash memory is partitioned such that memory locations above a certain memory address comprise the non-critical portion and memory locations below the memory address comprise the critical portion.

Because, generally, firmware is initially programmed at the factory and subsequently downloaded or transferred from another medium. Memory controller 702 need only be aware of the MLC state to binary value mapping when reading the firmware. The functionality for writing to the firmware partition using the binary value to MLC state mapping may be optionally excluded from memory controller 702. More specifically, suppose firmware contains two byte machine instructions B0 A2 (derived in this case from the x86 instructions for "MOV AL, A2h" which moves the hexadecimal value "A2" into register "AL". In one embodiment, the firmware is received without any binary value to MLC state mapping, so memory controller 702 upon receiving the firmware would write B0 A2 into critical portion 712 by first mapping the instructions using the appropriate binary value to MLC state mapping. For example if a 2BPC MLC mapping were used then B0 A2 would be mapped to CF 00 CC 0C. In an alternate embodiment, the firmware received would already be pre-encoded using a binary value to MLC state mapping. In the example of 2BPC MLC, the firmware instruction would be received as CF 00 CC 0C and written to critical portion 712 without any binary value to MLC state mapping on the part of the memory controller. In either case, upon reading the instructions, CF 00 CC 0C would be read and translated by memory controller 702 to B0 A2 as instructions for processor 302.

Figure 8:
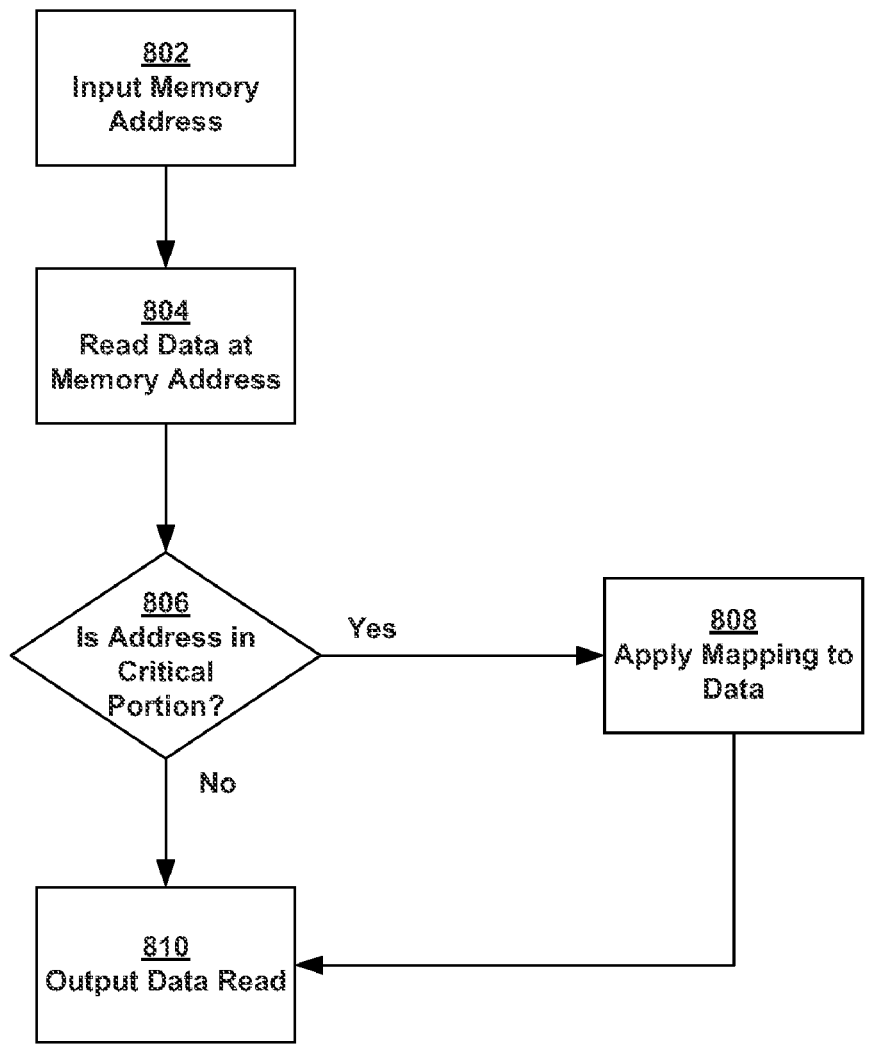
FIG. 8 shows an exemplary method of reading from partitioned MLC flash memory.

FIG. 8 shows an exemplary method of reading from partitioned MLC flash memory. At step 802, the memory controller receives a memory address. At step 804, the memory controller reads the data stored at the memory address. Depending on the configuration of the system, this may correspond to reading more than one flash memory cell. For example, an entire byte, word, double word, block or other data unit could be read. At step 806, a determination is made as to whether the memory address resides in the critical portion or the non-critical portion of the flash memory. If the memory address corresponds to the critical portion, the appropriate MLC state to binary value mapping is applied at step 808. The resultant data whether from the non-critical portion or the critical portion is then outputted by the memory controller at step 810.

Because per data unit, the critical portion will take up two or more times the storage than the non-critical portion, for example in a 3BPC MLC, to read 1 byte in the critical portion, 3 bytes need to be read, it may be desirable for the memory controller to hide this fact from the software.

Figure 9:
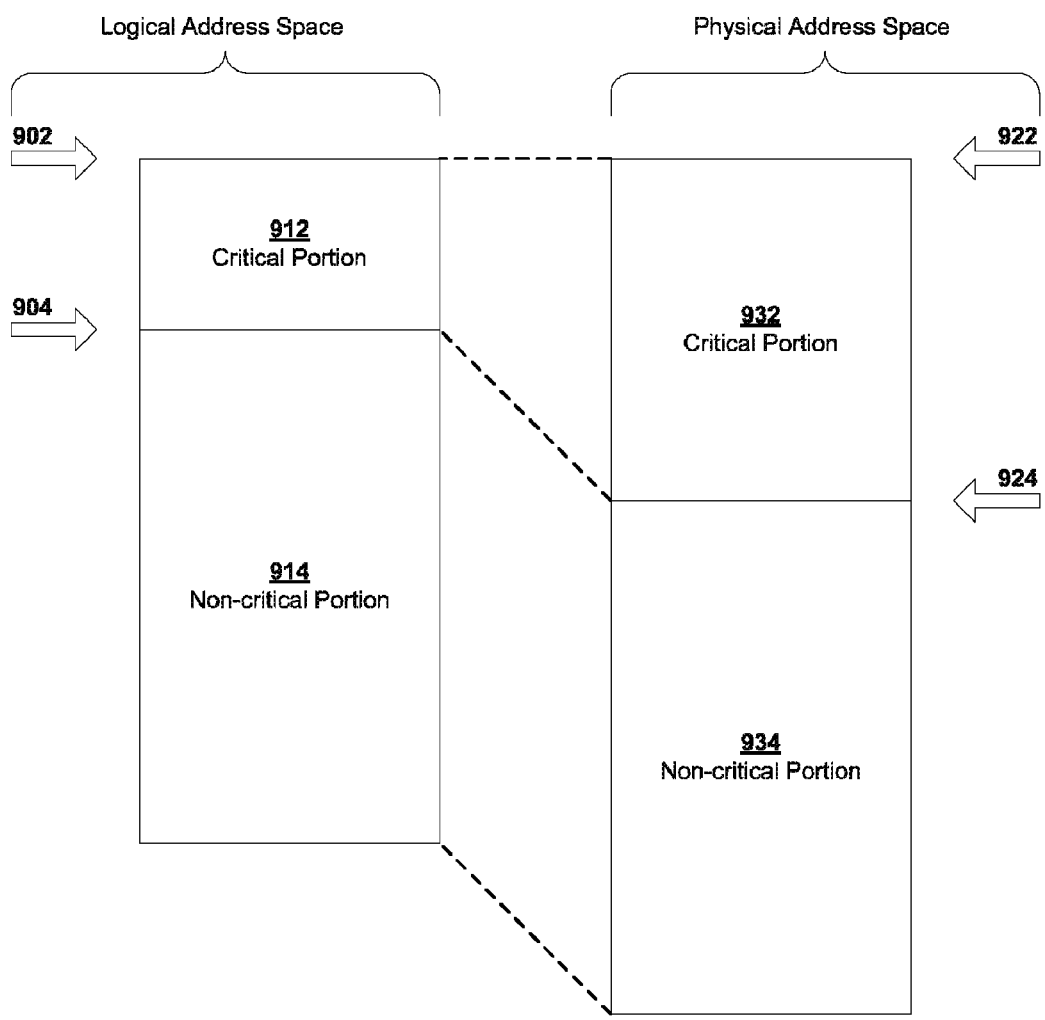
FIG. 9 shows a logical partitioning scheme for partitioning the firmware portion and the non-critical portion of flash memory.

FIG. 9 shows a memory logical partitioning scheme for partitioning the critical portion and the non-critical portion of flash memory. In this example, logical critical portion 912 starts at memory address 902 which corresponds to physical memory address 922. Logical non-critical portion 914 starts at memory address 904, which corresponds to physical memory address 924. Physical critical portion 932 is larger than logical critical portion 912 due to the binary value to MLC state mapping. The physical non-critical portion 934 is the same size as logical non-critical portion 914.

Figure 10:
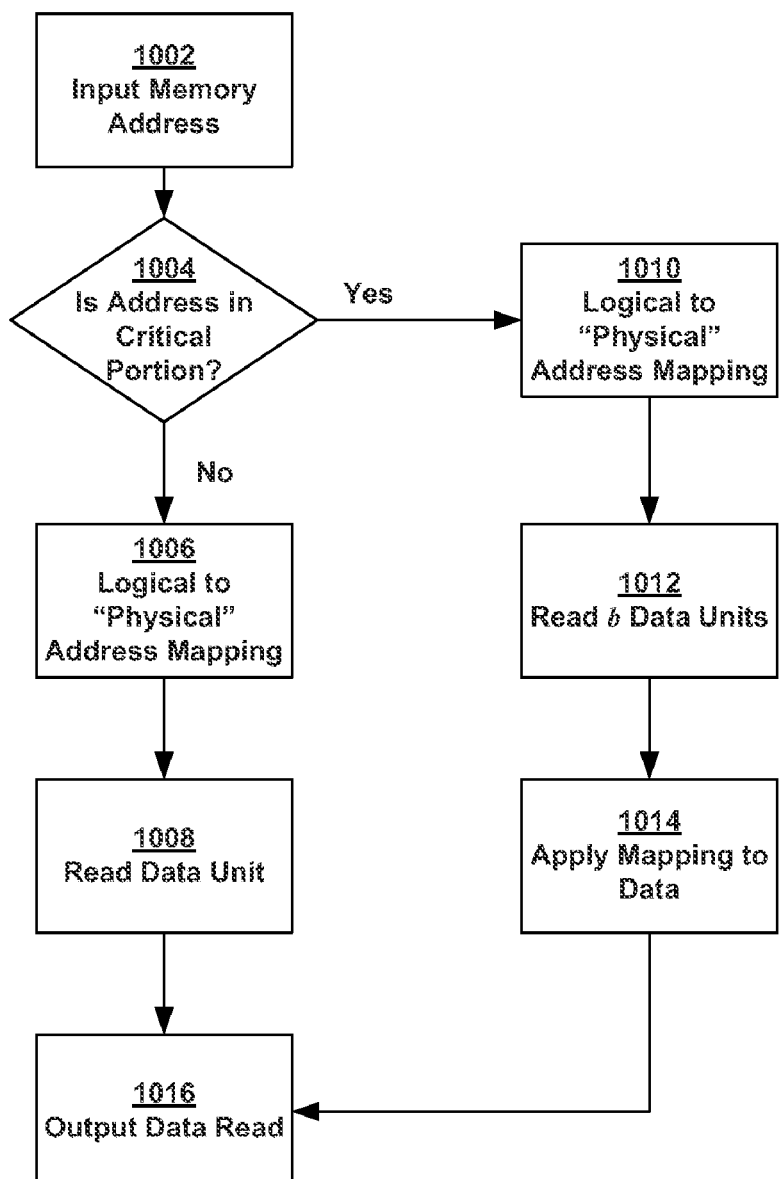
FIG. 10 is a flowchart illustrating a method for reading a data unit partitioned MLC flash memory using logical addressing.

FIG. 10 is a flowchart illustrating a method to read a data unit partitioned MLC flash memory using logical addressing. At step 1002, the memory controller receives a logical memory address. At step 1004 a determination is made as to whether the logical memory address is in the critical portion or in the non-critical portion of flash memory. If the logical memory address is in the non-critical portion, the logical memory address is mapped to a physical address for example, by adding an offset at step 1006. More specifically using the example of FIG. 9, the offset would be s(b−1), where s is the size of the critical portion and b is the number of bits per cell. At step 1008, a data unit is read from the physical address determined at step 1006. If the logical memory address is in the critical portion, the logical memory address is mapped to a physical address for example by applying a scale factor at step 1010. More specifically using the example of FIG. 9, a scale factor of b would be applied. If the partitioning were reversed from FIG. 9 (i.e., non-critical portion first), an offset would also be applied. At step 1012, b data units are read from the physical address determined at step 1010. At step 1014, the appropriate MLC state to binary mapping is applied to the b data units to produce one data unit. At step 1016, the data read is output from the memory controller.

It should be noted that steps 1006 and 1010 can be considered one step where the logical to physical mapping of both the critical portion and the non-critical portion are a single logical to physical mapping. It is shown separately here for clarity. In such a case this step can occur before step 1004.

As an example, suppose a 2 GB 2BPC MLC flash memory is partitioned to give 16 MB of logical memory for firmware. Physically, 32 MB would be needed for firmware because of the binary value to MLC state mapping. 2016 MB then remain for media memory. Logically, hexadecimal address 00000000 to hexadecimal address 00FFFFFF is allocated to firmware and hexadecimal address 01000000 to hexadecimal address 1 CFFFFFF is allocated to media. If physical addresses start at hexadecimal 00000000, a given logical address a would correspond to physical address 2a in the critical portion and a logical address a would correspond to physical address a+01000000 (hex) in the non-critical portion.

In the previous examples, information such as firmware can be pre-coded with a binary value to MLC state mapping, so that a memory controller need not employ a binary value to MLC state mapping to write to the critical portion of flash memory. However, there are some applications where low capacity reliable non-volatile storage is desired. For example, in a portable video game, reliable storage of saved game data may desirable. If a player spends countless hours working his/her way up to level 50 of a game, the player might view the saved game data as critical and bit errors in the saved game data could corrupt it to the point of being unusable. In such a case this data could also be stored in the critical portion of flash memory even though it is not firmware. Either the software can pre-encode the state stored to the critical portion of flash memory using a binary value to MLC state mapping or a portion of the critical portion can be allocated to storing non-firmware data.

Figure 11:
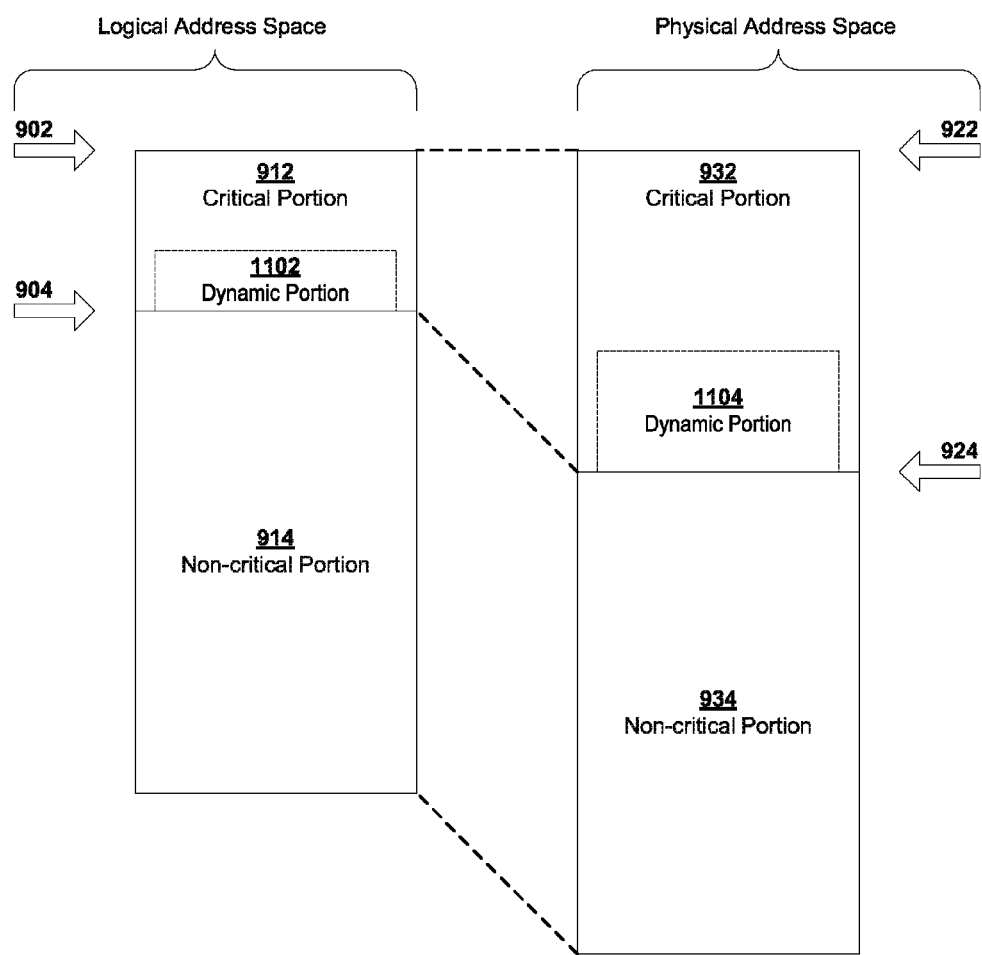
FIG. 11 shows an alternate embodiment of a memory partitioning scheme.

FIG. 11 shows an embodiment of a memory partitioning scheme with part of the critical portion partitioned designated for non-firmware data. As shown, the logical critical portion comprises a logical dynamic portion 1102 and corresponding physical memory comprises physical dynamic portion 1104. Data written to the dynamic portion 1102 is mapped using the appropriate binary value to MLC state mapping. In one embodiment, the software is aware of the mapping requirement and pre-encodes the data. In an alternate embodiment, the memory controller performs the mapping during a write. In the latter case, firmware may be supplied without the binary value to MLC state encoding and the data written to the critical portion would be mapped using the appropriate binary value to MLC state mapping by the memory controller.

Figure 12:
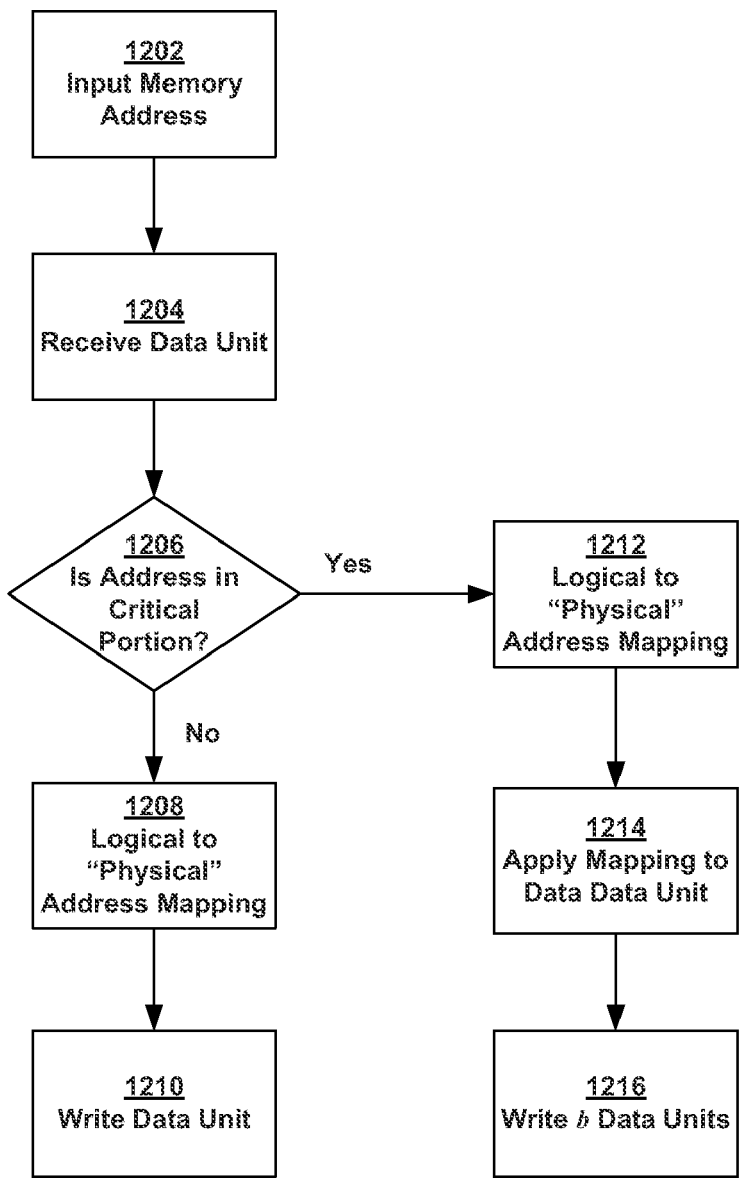
FIG. 12 is a flowchart illustrating an embodiment of the writing process of the memory controller.

FIG. 12 is a flowchart illustrating the writing process of the memory controller. At step 1202 the memory controller receives a memory address. At step 1204 the memory controller receives a data unit to write. At step 1206, a determination is made as to whether the memory address resides in the critical portion. If not, the appropriate logical to physical mapping for a memory address in the non-critical portion is performed at step 1208. At step 1210, the data unit is written to flash at the physical memory address determined in step 1208. Referring back to step 1206, if the memory address resides in the critical portion of flash memory, the appropriate logical to physical mapping for a memory address in the critical portion is performed at step 1212. At step 1214, the appropriate binary value to MLC state encoding is applied to the data unit, which results in b data units. At step 1216 the b data units are written to flash at the physical memory address determined in step 1210. In the alternative, firmware is pre-encoded and the software writing to the dynamic portion pre-encodes the data to be stored in which case no SLC to MLC encoding is applied at step 1214, but the pre-encoded data is written to flash at step 1216.

Alternatively, the critical portion of memory could be further partitioned into a static portion and a dynamic portion. The static critical portion can be used to hold firmware and the dynamic critical portion can be used to hold other "critical data." Reading from a critical memory portion would be the same as reading would be the same regardless of whether from the static critical portion or from the dynamic critical portion. However in writing to the dynamic critical portion, an appropriate binary value to MLC state mapping such as one of those shown in FIG. 4A, 5A or 6A would be applied.

If other critical data is to be stored in flash it is advantageous to partition the critical portion of flash into static and dynamic portions even if a binary value to MLC state mapping is used in both portions, that is, firmware is not pre-coded when stored into the critical portion of flash. In particular, the static and dynamic critical portions should partition according to block boundaries. As the dynamic critical portion is written to more frequently than the static critical portion partitioning static and dynamic critical portions would preserve the reliability of the static critical portion.

Figure 13:
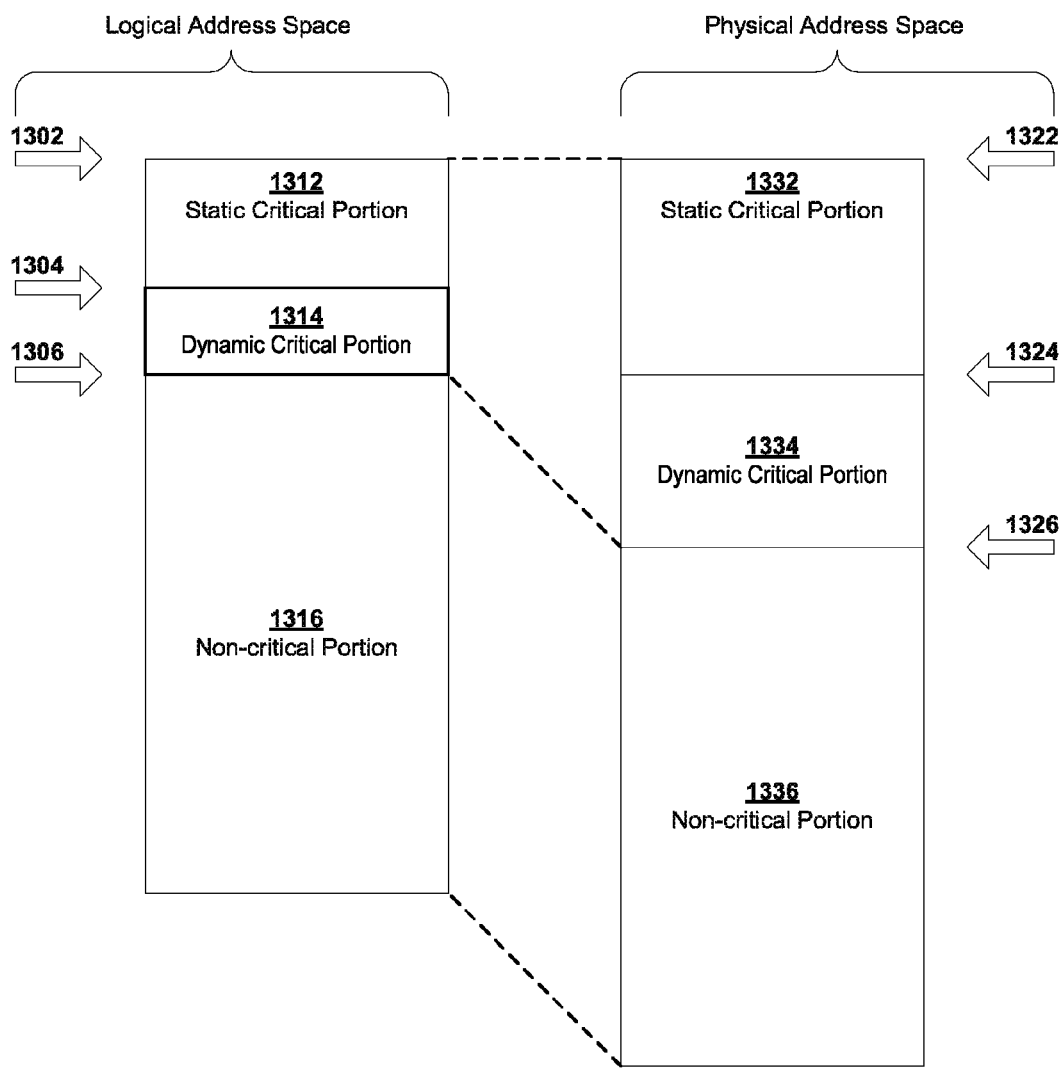
FIG. 13 shows an embodiment of a memory partitioning scheme which allocates a separate critical memory portion.

FIG. 13 shows an embodiment of a memory partitioning scheme which subdivides the critical portion into a static critical portion and a dynamic critical portion. In this example, logical static critical portion 1312 starts at memory address 1302 which corresponds to physical memory address 1322. Logical dynamic critical portion 1314 starts a memory address 1304 which corresponds to physical memory address 1324. Logical non-critical portion 1316 starts a memory address 1306 which corresponds to physical memory address 1326. Physical static critical portion 1332 and dynamic critical portion 1334 are at least twice as large as their logical counterpart. Physical non-critical portion 1336 may be the same size as logical non-critical portion 1316. A mapping between logical and physical addresses for each portion can be derived in a similar fashion to that of FIG. 9.

Figure 14:
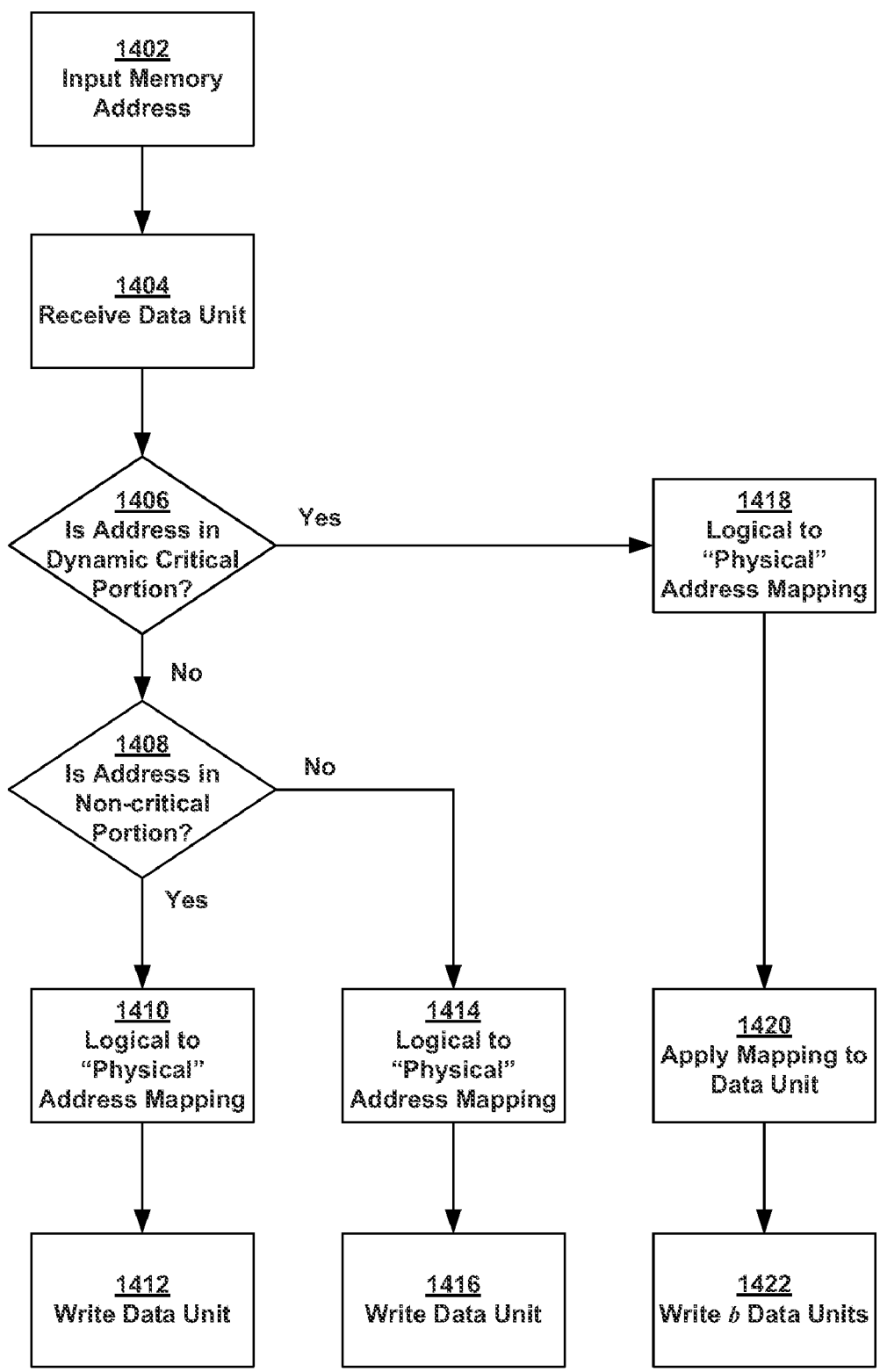
FIG. 14 is a flowchart illustrating an embodiment of the writing process of the memory controller in this three partition scheme.

In this embodiment, the static critical portion receives pre-encoded firmware to be written, but data written to dynamic critical memory is not pre-encoded. FIG. 14 is a flowchart illustrating an embodiment of the writing process of the memory controller in this three partition scheme. At step 1402 the memory controller receives a memory address. At step 1404 the memory controller receives a data unit to write. At step 1406, a determination is made as to whether the memory address resides in the dynamic critical portion, if not, at step 1408 a determination is made as to whether the memory address resides in the non-critical portion. If the memory address resides in the non-critical portion, then the appropriate logical to physical mapping for a memory address in the non-critical portion is performed at step 1410. At step 1412 the data unit is written to flash at the physical memory address determined in step 1412. If the memory address resides in the static critical portion then the appropriate logical to physical mapping for a memory address in the static critical portion is performed at step 1414 and the data unit is written to flash at that address at step 1416. If the memory address resides in the dynamic critical memory portion then, the appropriate logical to physical mapping for a memory address in the dynamic critical memory portion is performed at step 1418. At step 1420, the appropriate binary value to MLC state encoding is applied to the data unit, which results in b data units. At step 1422 the b data units are written to flash at the physical memory address determined in step 1416.

It will be appreciated that the location of the critical portion and the non-critical portion in this and previously described embodiments could be reversed, and that other configurations can be used, resulting in a different logical to physical mapping. Furthermore, the locations of the dynamic critical portions and static critical portions can be reversed or even separated by the non-critical portion. Furthermore, there is no need for the critical portion (including dynamic and static) and the non-critical portion to be contiguous, although contiguous portions lead to easier logical to physical mappings, non-contiguous portions enable more even wear leveling as discussed below. However, it is desirable that because flash memory is block erased, that the partitioning not subdivide blocks.

It should also be noted that read and write are intended to include any caching or block reading operation a lower level system or lower level portion of the memory controller may perform. Often, because rewriting flash requires a block erasure operation, writing to flash actually may comprise writing to a cache which ultimately is written to flash. Likewise, when reading from flash, there may be an intervening cache.

It should be noted that the term physical address is used loosely and is a relative term. For instance, a lower level system may additionally perform a logical to physical mapping, so that what appears to the memory controller, or at least the portion of the memory controller responsible for the MLC state to binary value and the binary values to MLC state mappings, sees as a physical address is in actually another logical address created as an abstraction of a lower level system or lower level portion of the memory controller. As an example, often memory controllers employ wear leveling, which is a technique used to prolong the life of the flash memory. Because the number of times a block of flash memory can be erased is limited, a memory address which is written to more frequently would "wear out" more quickly. To avoid this, a memory controller arranges the blocks so that erasures are distributed evenly across the flash memory, thus no single block fails due to excessive write cycles. Often times a logical to physical address mapping is performed by the memory controller for the purposes of wear leveling. Therefore, the logical to physical address mapping and physical to logical address mapping performed here can actually be a logical address to logical "wear leveled" address mapping and a logical wear leveled address to logical address mapping.

However, it may be desirable for wear leveling to consider the partitioning of critical and non-critical portions. For example, it may not be desirable to wear level the critical portion of flash memory, because it contains firmware which may only be rewritten a few times over the life of the product. Thus, even when the non-critical portion becomes unviable, the critical portion may still be operable. Some consumer devices might still have some uses even after the media memory has become unviable. As an example, an inexpensive camcorder may no longer be able to record to memory but could still function as a web camera.

Thus far, the MLC state to binary value mappings have subdivided the MLC states equally into those to be mapped to a high binary value and those to be mapped to a low binary value. These correspond to simply taking the most significant bit of the value read from the MLC cell. Over time, electrons stored for a prolonged period can leak out of the floating gate causing a change the threshold voltage to decrease. If sufficient electrons leak out there can be change in MLC states. Furthermore, in the read process a voltage is applied to the gate of an MLC cell, but not sufficient to alter the amount of charge on the floating gate in theory. In practice, due to quantum effects there is a probability that an electron can jump to the floating gate due to the voltage applied. As a result, flash memory cells undergoing a large number of read operations between erasures are susceptible to electrons jumping onto the floating gate causing a increase in floating the threshold voltage which ultimately can cause a change in MLC states. As for whether one effect occurs more commonly can vary from situation to situation. However, if for a particular application, a tendency is determined, the MLC state to binary value mapping can take this tendency into account, particularly in the 3BPC or higher bits per cell MLC where the threshold voltages for the MLC states are closer together.

Figures 15A, 15B:
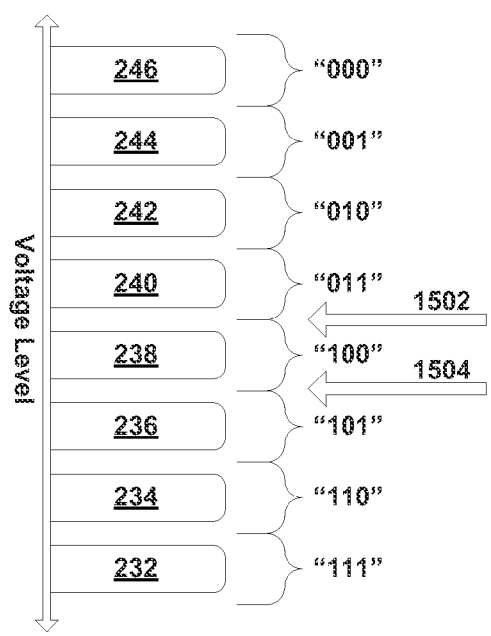
FIG. 15A shows the relationships between threshold voltages and program states a 3BPC flash memory cell.
FIG. 15B is an MLC state to binary mapping corresponding to a different central cutoff voltage.

FIG. 15A once again shows the relationships between threshold voltages and program states a 3BPC flash memory cell. Central cutoff voltage 1502 marks the midpoint of the MLC states. In this example, it is assumed that there is a greater tendency to leak charge out, it may be more likely for the "000" state to leak out to the "001" state than the "111" state to jump into the "110" state. If that is the case, central cutoff voltage 1504 can be used instead. FIG. 15B is an MLC state to binary mapping corresponding to central cutoff voltage 1504. In particular it should be noted that unlike FIG. 5B, the MLC state "100" is read as binary value "0" rather than binary value "1".

It should be emphasized that the above-described embodiments are merely examples of possible implementations. Many variations and modifications may be made concurrently or in a different order. All such modifications and variations are intended to be included herein within the scope of this disclosure and protected by the following claims.

What is claimed:
1. An electronic device comprising:
a processing unit;
a multi-level cell (MLC) flash memory comprising a plurality of multi-level memory cells comprising a plurality of MLC states, the MLC flash memory comprising a critical portion; and
a memory controller interfacing the MLC flash memory with the processing unit, the memory controller responsive to read instructions from the processing unit to read a binary value from an MLC state stored in a given multi-level memory cell in the critical portion, wherein each MLC state has an associated threshold voltage and the memory controller is configured to read a first binary value from a given multi level memory cell whenever the given multi level memory cell is in a first MLC state having a threshold voltage greater than a cutoff threshold voltage and a second binary value whenever the given multi level memory cell is in a second MLC state having threshold voltage less than a cutoff threshold voltage.

2. The electronic device of claim 1, wherein the MLC flash memory further comprises a non-critical portion; and the memory controller is responsive to read instructions from the processing unit to read multiple bits of data from an MLC state stored in a given multi-level memory cell.

3. The electronic device of claim 2, wherein the memory controller responsive to write instructions from the processor that stores MLC data into the critical portion is configured to store a high MLC value corresponding to a lowest threshold voltage.

4. The electronic device of claim 2, wherein the memory controller responsive to write instructions from the processor that stores MLC data into the critical portion is configured to store a low MLC value.

5. The electronic device of claim 2, wherein the memory controller responsive to write instructions from the processor that stores MLC data into the critical portion is configured to store a low MLC value corresponding to a highest threshold voltage.

6. The electronic device of claim 2, wherein the memory controller responsive to write instructions from the processor is configured to store MLC data into the critical portion where the MLC data comprises only a high MLC value corresponding to a lowest threshold voltage and/or a low MLC value and/or a low MLC value corresponding to a highest threshold voltage.

7. The electronic device of claim 2, wherein the memory controller responsive to write instructions from the processor is configured to write data comprising a first binary value and a second binary value into the critical portion by storing a highest MLC state whenever an instruction to write a first binary value is encountered and by storing a lowest MLC state whenever an instruction to write a second binary value is encountered.

8. The electronic device of claim 7, wherein the MLC flash memory is a 2BPC flash memory and a 11 MLC state is the highest MLC state and a 00 MLC state is the lowest MLC state.

9. The electronic device of claim 7, wherein the MLC flash memory is a 3BPC flash memory and a 111 MLC state is the highest MLC state and a 000 MLC state is the lowest MLC state.

10. The MLC flash cell of claim 9, wherein the MLC flash memory is a 4BPC flash cell and a 1111 MLC state is the highest MLC state and a 0000 MLC state is the lowest MLC state.

11. The electronic device of claim 7 wherein the MLC flash memory is a Gray coded 2BPC flash memory and a 10 MLC state is the highest MLC state and a 00 MLC state is the lowest MLC state.

12. The electronic device of claim 7, wherein the wherein the MLC flash memory is a Gray coded 2BPC flash memory and a 100 MLC state is the highest MLC state and a 000 MLC state is the lowest MLC state.

13. The electronic device of claim 2, wherein the critical portion comprises a static critical portion and a dynamic critical portion;

wherein the memory controller responsive to write instructions from the processor is configured to store MLC data into the static critical portion where the MLC data comprises only a high MLC value corresponding to a highest MLC state and/or a low MLC value corresponding to the lowest MLC state; and the memory controller is responsive to write instructions from the processor writes data comprising a first binary value and a second binary value into the dynamic critical portion by storing a highest MLC state whenever an instruction to write a first binary value is encountered and by storing a lowest MLC state whenever an instruction to write a second binary value is encountered.

14. The electronic device of claim 1 wherein the MLC flash is a 2-bit per cell (2BPC) flash memory and the plurality of MLC states comprise a 00 state, a 01 state, a 10 state and a 11 state, and the memory controller is configured to read a first binary value from a given multi level memory cell whenever the given multi level memory cell is in the 10 state or the 11 state and a second binary value whenever the given multi level memory cell is in the 00 state or the 01 state.

15. The electronic device of claim 1 wherein the MLC flash is a 3-bit per cell (3BPC) flash memory and the plurality of MLC states comprise a 000 state, a 001 state, a 010, a 011 state, 100 state, a 101 state, a 110 state and a 111 state, and the memory controller is configured to read a first binary value from a given multi level memory cell whenever the given multi level memory cell is in the 100 state, the 101 state, the 110 state or the 111 state and a second binary value whenever the given multi level memory cell is in the 000 state, the 001 state, the 010 state or the 011 state.

16. The electronic device of claim 15, wherein the MLC flash memory is a 4BPC flash memory and a 1111 MLC state is the highest MLC state and a 0000 MLC state is the lowest MLC state.

17. The electronic device of claim 1 wherein the MLC flash is a 4-bit per cell (4BPC) flash memory and the plurality of MLC states comprise a 0000 state, a 0001 state, a 0010, a 0011 state, 0100 state, a 0101 state, a 0110 state, a 0111 state, a 1000 state, a 1001 state, a 1010, a 1011 state, 1100 state, a 1101 state, a 1110 state and a 1111 state, and the memory controller is configured to read a first binary value from a given multi level memory cell whenever the given multi level memory cell is in the 1000 state, the 1001 state, the 1010 state, the 1011 state, the 1100 state, the 1101 state, the 1110 state or the 1111 state and a second binary value whenever the given multi level memory cell is in the 0000 state, the 0001 state, the 0010 state, 0011 state, the 0100 state, the 0101 state, the 0110 state or the 0111 state.

18. The electronic device of claim 1, wherein the electronic device is a digital camera, a printer, a multi-function peripheral, a scanner, a music player, a portable video game, a camcorder, a digital picture frame, a cellular telephone, or a combination thereof.

19. A multi-level cell (MLC) flash memory comprising:

a critical portion and a non-critical portion, each portion comprising a plurality of memory cells;

wherein data stored in each memory cell in the non-critical portion is stored in one of a plurality of MLC states, said plurality including a highest MLC state and a lowest MLC state; and wherein data stored in each memory cell in the critical portion is stored in either the highest MLC state or the lowest MLC state, wherein the MLC flash memory is a 3BPC flash memory and a 111 MLC state is the highest MLC state and a 000 MLC state is the lowest MLC state.

20. The MLC flash memory of claim 19, wherein each MLC state has an associated threshold voltage, the memory controller is configured to read a first binary value from a given multi level memory cell whenever the given multi level memory cell is in a MLC state having a threshold voltage greater than a cutoff threshold voltage and a second binary value whenever the given multi level memory cell is in a MLC state having threshold voltage less than a cutoff threshold voltage, and wherein the MLC flash memory is 2BPC flash memory and a 11 MLC state is the highest MLC state and a 00 MLC state is the lowest MLC state.

21. The method of claim 20, wherein the data unit is selected from the group consisting of a byte, a word, a double word, and a block.

22. The MLC flash memory of claim 19, wherein the MLC flash memory is a 4BPC flash memory and a 1111 MLC state is the highest MLC state and a 0000 MLC state is the lowest MLC state.

23. A method of reading multi-level cell (MLC) flash memory having a critical portion and a non-critical portion comprising:
    receiving a memory address;
    reading data at the memory address;
    determining whether the memory address is in the critical portion;
    if the memory address is in the critical portion, assigning a binary value to each MLC state read from the data stored at the memory address; and
    wherein a first binary value is assigned if the MLC state read has an associated threshold voltage greater than a central cutoff threshold voltage and a second binary value is assigned if the MLC state read has an associated threshold voltage less than a central cutoff threshold voltage.

24. The method of claim 23, wherein the flash memory is a b-bits per cell flash, wherein b is an integer having a value of 2 or more, said method further comprising:

obtaining a physical address from the memory address using a logical to physical mapping; and
    wherein reading the data at the memory address comprises reading a data unit if the memory address is in the non-critical portion and reading b data units in the critical portion.

25. A method of storing a binary value into a multi-level cell (MLC) flash cell comprising:
    programming a first MLC state corresponding to a highest threshold voltage if the binary value is a first binary value;
    programming a second MLC state corresponding to a lowest threshold voltage if the binary value is a second binary value, wherein the MLC flash cell is a 3BPC flash cell and a 111 MLC state is the highest MLC state and a 000 MLC state is the lowest MLC state.

26. The method of claim 25, wherein the first binary value is a 1 and the second binary value is a 0.

27. The method of claim 25, wherein each MLC state has an associated threshold voltage, the memory controller reads a first binary value from a given multi level memory cell whenever the given multi level memory cell is in the first MLC state having a threshold voltage greater than a cutoff threshold voltage and a second binary value whenever the given multi level memory cell is in the second MLC state having threshold voltage less than a cutoff threshold voltage, and the MLC flash cell is a 2BPC flash cell and a 11 MLC state is the highest MLC state and a 00 MLC state is the lowest MLC state.

* * * * *

UNITED STATES PATENT AND TRADEMARK OFFICE
CERTIFICATE OF CORRECTION

| | | |
|---|---|---|
| PATENT NO. | : 8,301,828 B2 | Page 1 of 1 |
| APPLICATION NO. | : 12/792592 | |
| DATED | : October 30, 2012 | |
| INVENTOR(S) | : Mark E. Miller | |

It is certified that error appears in the above-identified patent and that said Letters Patent is hereby corrected as shown below:

Column 13, line 58, delete the second occurrence of "wherein"
    Column 13, line 59, delete "the"

Signed and Sealed this
Twenty-fifth Day of December, 2012

David J. Kappos
*Director of the United States Patent and Trademark Office*